United States Patent [19]

Williams

[11] Patent Number: 4,470,145

[45] Date of Patent: Sep. 4, 1984

[54] SINGLE SIDEBAND QUADRICORRELATOR

[75] Inventor: Austin M. Williams, Diamond Bar, Calif.

[73] Assignee: Hughes Aircraft Company, El Segundo, Calif.

[21] Appl. No.: 401,682

[22] Filed: Jul. 26, 1982

[51] Int. Cl.³ .............................................. H03D 1/24
[52] U.S. Cl. .......................................... 375/1; 329/50; 329/124; 375/77; 375/87
[58] Field of Search ...................... 331/1 A; 375/1, 77, 375/97, 87, 80, 84; 329/50, 107, 124; 455/202, 257, 260

[56] References Cited

U.S. PATENT DOCUMENTS

| 3,568,067 | 3/1971 | Williford | 375/84 |
| 3,611,144 | 10/1971 | Harmon, Jr. et al. | 329/50 |
| 3,634,773 | 1/1972 | Kobayashi et al. | 329/50 |
| 3,675,131 | 7/1972 | Pickholtz | 375/77 |

Primary Examiner—Benedict V. Safourek
Attorney, Agent, or Firm—W. J. Benman, Jr.; A. W. Karambelas

[57] ABSTRACT

A supplementary frequency acquisition circuit in the form of a frequency difference detector called a single sideband quadricorrelator is provided. When used in conjunction with a phase-locked loop of a conventional spread spectrum demodulator, this circuit allows for the rapid acquisition and accurate tracking of the center frequency of a spread spectrum suppressed-carrier biphase PSK signal. The invention cancels spurious sum and difference frequency components impulsed at the data rate as well as double difference frequency component and other modulation products without filtering. By eliminating the need for supplementary low pass filtering, the present invention provides rapid acquisition of the suppressed-carrier signal and provides a frequency difference output at twice the amplitude of comparable prior art systems. The tracking error or frequency difference ($\omega_i - \omega_o$) is obtained by differentiating the quadrature signal and multiplying by the inphase signal component rotated 180° in phase. This product is summed with the output obtained by multiplying the differentiated in-phase signal component with the quadrature signal component.

3 Claims, 2 Drawing Figures

SINGLE SIDEBAND QUADRICORRELATOR

BACKGROUND OF THE INVENTION

1. Field of the Invention

This invention relates generally to communication systems. More specifically, this invention relates to receivers used in spread spectrum, suppressed-carrier, bi-phase, phase shift keyed (PSK) communications systems.

While the present invention will be described herein with reference to a particular embodiment in a particular application, it is to be understood that those of ordinary skill in the art with access to the teachings of this invention will realize additional applications and embodiments within the scope thereof.

2. Description of the Prior Art

Spread spectrum techniques have proved to be invaluable in space, military and commercial communication systems where interference rejection, eavesdrop protection, signal hiding or access control is desired. As discussed by R. C. Dixon in *Spread Spectrum Systems* (1st Ed. 1976), a spread spectrum system is one in which the transmitted signal is spread over a frequency band much wider than that required to transmit the information being sent. The spreading is accomplished by modulation of the baseband signal with a carrier signal which is modulated, shifted or swept over a band of frequencies.

Carrier modulation or direct sequence is, for good reason, the most widely used spread spectrum technique. Moreover, bi-phase balanced modulation is the preferred carrier modulation technique because: (1) the carrier is suppressed and difficult to detect; (2) more power is available for sending information; (3) transmitted power efficiency is maximized; and (4) the modulator typically has a simple design with a low parts count.

The advantages of spread spectrum tranmission can not be realized without spread spectrum reception. Spread spectrum signals are usually demodulated in two steps. First, the spectrum-spreading modulation is removed and, second, the information bearing signal is demodulated. In direct sequence systems, the first step is accomplished by multiplication of the received signal by a local reference signal which is identical to the carrier in structure and synchronized in time. While structure identity is usually provided by design, synchronization is usually provided by a phase-locked loop. See *Phase-Lock Techniques*, by Floyd M. Gardner, pp. 217-230, (2nd Ed. 1979).

In a spread spectrum system the phase-locked loop must quickly acquire and accurately track the transmitted signal. To this end, the performance of such systems has been substantially enhanced by supplementing the phase-locked loop with a frequency acquisition circuit. Typical supplementary frequency acquisition circuits include sweep circuits and frequency discriminators. Donald Richmond develop such a circuit called a 'quadricorrelator'. See "Color-Carrier Reference Phase Synchronization in NTSC Color Television", Proc. IRE, Vol. 22, pp. 106-133, January 1954.

Richmond's quadricorrelator differentiates and in-phase signal component and multiplies the differentiated signal by a quadrature signal component to obtain a DC output proportional to the frequency difference between a locally generated reference oscillator and an applied synch signal.

Unfortunately, the output signal also includes a sinusoidal signal of equal amplitude at double the difference frequency. This double frequency component is undesirable and is difficult to filter out as the frequency difference term goes to zero in a closed loop system. Use of a low pass filter is undesirable insofar as it imposes a substantial penalty on the acquisition time of the quadricorrelator.

In addition, bi-phase PSK systems with suppressed-carrier may have a doppler induced frequency offset that must be removed for accurate reception. Thus, the present state of the art in spread spectrum systems is believed to be such that there is a need for a system that rapidly acquires and accurately tracks the center frequency of a spread spectrum suppressed-carrier bi-phase PSK signal.

SUMMARY OF THE INVENTION

The present invention is a supplementary frequency acquisition circuit in the form of a frequency difference detector called a single sideband quadricorrelator which when used in conjunction with a phase-locked loop of a conventional spread spectrum demodulator allows for the rapid acquisition and accurate tracking of the center frequency of a spread spectrum suppressed-carrier bi-phase PSK signal. The single sideband quadricorrelator of the present invention cancels spurious sum and difference frequency components impulsed at the data rate as well as the above-identified double difference frequency component and other modulation products without filtering, even with the carrier frequency of the input signal totally suppressed. By eliminating the need for supplementary low pass filtering, the present invention provides rapid acquisition of the suppressed-carrier signal and provides a frequency difference output at twice the amplitude of comparable prior art systems. This advantageous operation is accomplished by differentiating the quadrature signal and multiplying it by the in-phase signal component rotated 180° in phase. This product is summed with the output obtained by multiplying the differentiated in-phase signal component with the quadrature signal component.

The invention includes means for processing an input signal of the form $m(t)\sin \omega_i t$ to provide in-phase and quadrature signal components of the form $\sin(\omega_i - \omega_o)t$ and $\cos(\omega_i - \omega_o)t$, respectively, where such signals are not otherwise provided. The invention further includes means for differentiating these first and second signals to provide third and fourth signals, respectively. Multiplier means are provided for multiplying the third signal by the second signal to provide a fifth signal and for multiplying the first signal rotated 180° in phase by the fourth signal and to provide a sixth signal. Summing means are provided for adding the fifth and sixth signals to provide the frequency difference output.

DETAILED DESCRIPTION OF THE INVENTION

Figure 1:
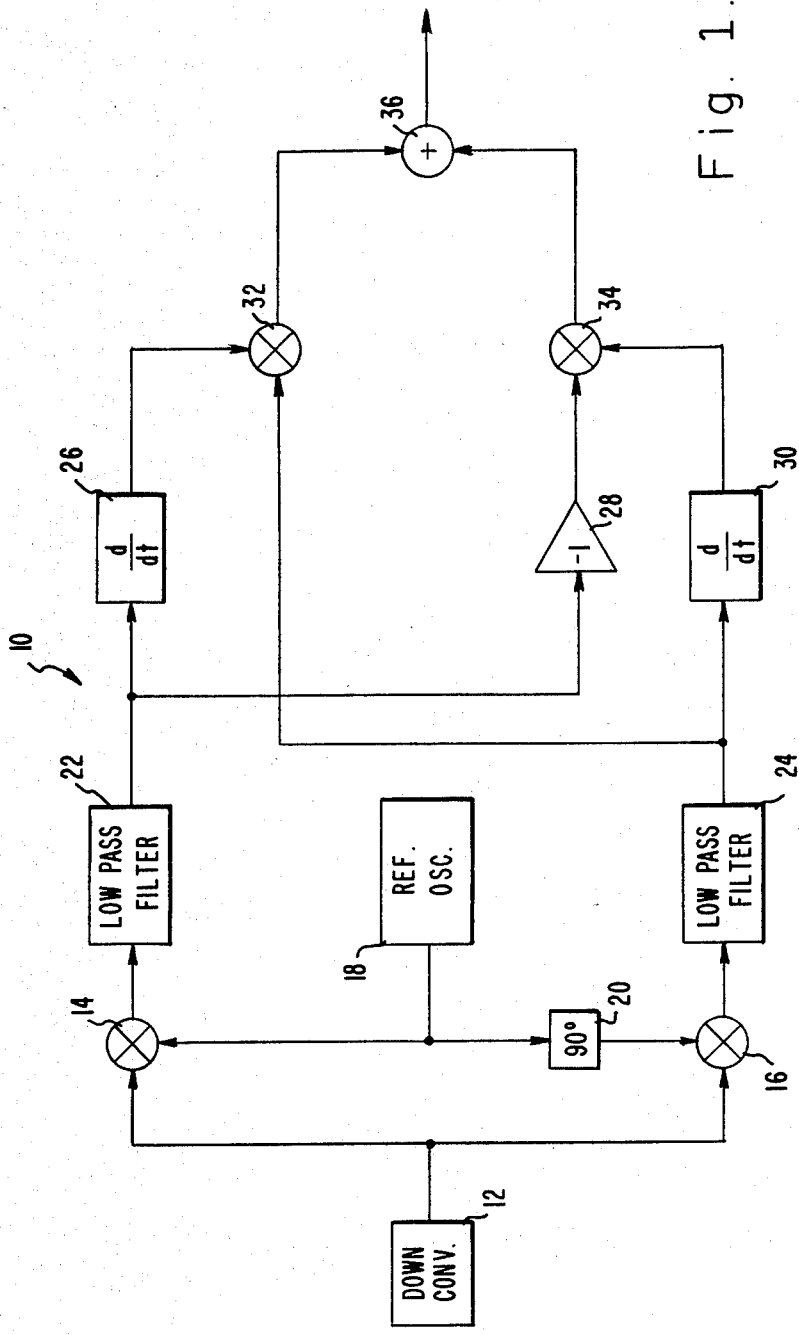
FIG. 1 is a schematic diagram representation of the single sideband quadricorrelator of the present invention.
Figure 2:
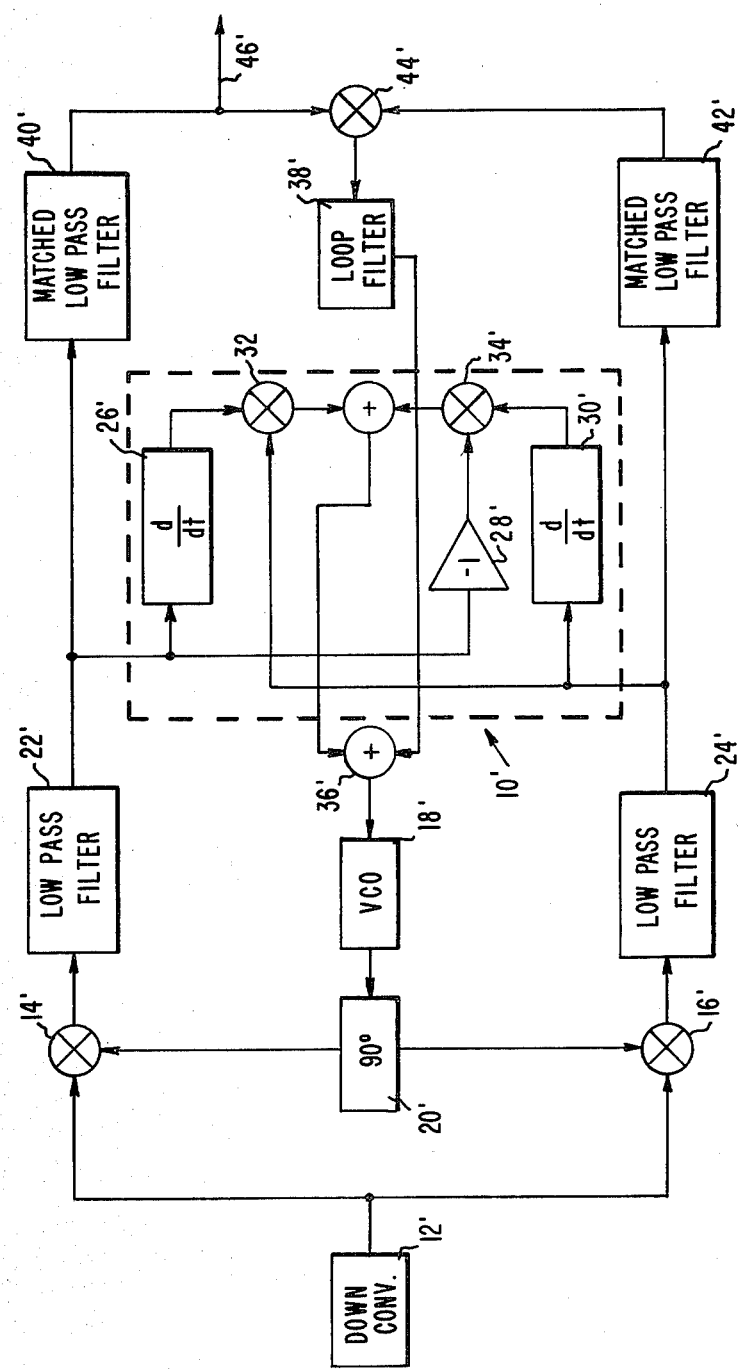
FIG. 2 is a schematic diagram representation of the single sideband quadricorrelator of the present invention used in conjunction with a Costas Loop to provide a complete bi-phase demodulator.

While the present invention will be described herein with reference to FIGS. 1 and 2 showing illustrative schematic diagram representations of the invention, it is to be understood that the invention is not limited thereto. Those having ordinary skill in the art will recognize that the teachings of the present invention may be employed to implement this invention through digital circuitry or in software. The structure and operation of the embodiments of FIGS. 1 and 2 will now be described, followed by a mathematical analysis of the operation of the invention on a typical PSK modulated signal.

FIG. 1 shows the single sideband quadricorrelator of the present invention 10 adapted to receive an input signal of the form $\sin \omega_i t$ from a down converter or other receiving means 12 which is not considered to be part of the invention. The input signal is coupled to first and second multipliers 14 and 16, respectively. The multipliers 14 and 16 cooperate with a reference oscillator 18, a 90° phase shifter 20 and first and second low pass filters 22 and 24 to provide a conventional quadrature output. Note that the output of the reference oscillator 18 is of the form $2 \cos \omega_o t$ while that of the 90° phase shifter is $2 \sin \omega_o t$.

The quadrature output signals are of the form $\sin(\omega_i - \omega_o)t$ and $\cos(\omega_i - \omega_o)t$ at the outputs of low pass filters 22 and 24. The first signal $\sin(\omega_i - \omega_o)t$ is input to a differentiator 26 and a 180° phase shifter or inverter 28. The second signal $\cos(\omega_i - \omega_o)t$ is input to a second differentiator 30 and a third multiplier 32. It should be noted that the differentiators 26 and 30 may be of conventional analog design, or implemented digitally without departing from the scope of this invention. The multipler 32 also receives input from the first differentiator 26 and provides an output which is the product of the differentiated first signal and the second signal. Since the differentiated first signal would be of the form $(\omega_i - \omega_o) \cos(\omega_i - \omega_o)t$, the output of the multiplier 32 is of the form $\frac{1}{2}(\omega_i - \omega_o)[1 + \cos 2(\omega_i - \omega_o)]$. A fourth multiplier 34 receives a signal of the form $-\sin(\omega_i - \omega_o)t$ from the phase shifter 28 and $-(\omega_i - \omega_o)\sin(\omega_i - \omega_o)t$ from the second differentiator 30. Accordingly, its output is of the form $\frac{1}{2}(\omega_i - \omega_o)[1 - \cos 2(\omega_i - \omega_o)]$. Finally, the outputs of the multipliers 32 and 34 are combined by summer 36 to provide an output signal of the form $(\omega_i - \omega_o)$.

FIG. 2 shows a more complete demodulator including the single sideband quadricorrelator 10' in a Costas Loop to provide rapid acquisition of signals with a large frequency offset. The quadrature hybrid including first and second multipliers 14' and 16', 90° hybrid or phase shifter 20', low pass filters 22' and 24' and a voltage controlled oscillator (VCO) 18' is provided by the Costas Loop so it need not be shown as part of the single sideband quadricorrelator 10'. In this application, the output of the single sideband quadricorrelator 10' is summed at 36' with the output of a loop filter 38'. The loop filter 38' is typically an op amp (operational amplifier) integrator having a large gain at DC. Its input is the product of the sin and cos of the frequency difference between the VCO 18' and the input signal as filtered by low pass filters 40' and 42'. These filters are matched to the data rate to reduce the noise bandwidth thereby improving the signal to noise ratio. They provide inputs to the four quadrant multiplier 44' which in turn provides the loop filter 38' with sinusoidal sum and difference terms. The loop filter 38' rejects the sum term and feeds forward to summer 36' a DC error voltage to control the voltage controlled oscillator 18.

In operation, the suppressed-carrier of the input signal $\sin \omega_i t$ is rapidly acquired by the single sideband quadricorrelator 10' in the manner described above. Note that without the single sideband quadricorrelator of the present invention 10' the Costas Loop would have difficulty rapidly acquiring a signal with a large frequency offset because the corresponding in-phase and quadrature would be outside the passband of the matched low pass filters 40' and 42'. As the difference term $(\omega_i - \omega_o)$ approaches zero as the single sideband quadricorrelator 10' tracks the carrier, the Costas Loop becomes active and supplies a DC error correction voltage to the voltage controlled oscillator 18'. This circuit thus provides rapid acquisition and tight tracking of the suppressed-carrier signal.

The operation of the single sideband quadricorrelator can be further illustrated by the following mathematical analysis. If the input signal is assumed to be of the form $m(t)\sin \omega_i t$ and the output of the reference oscillator is given to be $2 \cos \omega_o t$ then the input to the low pass filter 22 will be of the form:

$$(m(t)\sin \omega_i t)(2 \cos \omega_o t) = 2m(t)\sin \omega_i t \cos \omega_o t = m(t)\sin(\omega_i - \omega_o)t + m(t)\sin(\omega_i + \omega_o)t \quad [1]$$

The sum term of the Equation 1 above is removed by the low pass filter 22 so that the input to the differentiator 26 is of the form $m(t)\sin(\omega_i - \omega_o)t$. Taking the derivatives yields:

$$\frac{d[m(t)\sin(\omega_i - \omega_o)t]}{dt} = \quad [2]$$

$$m(t)(\omega_i - \omega_o)\cos(\omega_i - \omega_o)t + \sin(\omega_i - \omega_o)t \frac{d[m(t)]}{dt}$$

Multiplying Equation 2 above by the output of low pass filter 24, a quadrature signal of the form $m(t)\cos(\omega_i - \omega_o)t$, yields:

$$[m(t)\cos(\omega_i - \omega_o)t]\left[m(t)(\omega_i - \omega_o)\cos(\omega_i - \omega_o)t + \sin(\omega_i - \omega_o)t \frac{d[m(t)]}{dt}\right] = \quad [3]$$

$$\frac{[m(t)]^2(\omega_i - \omega_o)}{2}[1 + \cos 2(\omega_i - \omega_o)t] +$$

$$m(t)\cos(\omega_i - \omega_o)t \sin(\omega_i - \omega_o)t \frac{d[m(t)]}{dt}$$

In a similar manner, taking the derivative of the output of low pass filter 24 yields:

$$\frac{d[m(t)\cos(\omega_i - \omega_o)t]}{dt} = \quad [4]$$

$$-m(t)(\omega_i - \omega_o)\sin(\omega_i - \omega_o)t + \cos(\omega_i - \omega_o)t \frac{d[m(t)]}{dt}$$

Multiplying the Equation 4 above by the difference term of Equation 1 above and $-1$ yields:

$$[-m(t)\sin(\omega_i - \omega_o)t]\left[-m(t)(\omega_i - \omega_o)\sin(\omega_i - \omega_o)t + \quad [5]\right.$$

$$\cos(\omega_i - \omega_o)t \frac{d[m(t)]}{dt} \Bigg] =$$

$$\frac{m(t)^2(\omega_i - \omega_o)}{2} [1 - \cos 2(\omega_i - \omega_o)t] -$$

$$m(t)\cos(\omega_i - \omega_o)t \sin(\omega_i - \omega_o)t \frac{d[m(t)]}{dt}$$

Adding Equations 3 and 5, all terms cancel except: $[m(t)^2(\omega_i - \omega_o)]$ where, for bi-phase PSK modulation, $m(t) = \pm 1$, and $[m(t)]^2 = 1$, leaving only the desired output signal $(\omega_i - \omega_o)$.

While the single sideband quadricorrelator frequency difference detector of the present invention has been described with reference to particular embodiments, it is to be understood that those having ordinary skill in the art and access to the teachings of this invention will recognize additional embodiments within the scope thereof. For example, the differentiation, phase shifting, multiplying and summing operations performed by the present invention may also be performed digitally or in software.

What is claimed is:

1. A single sideband quadricorrelator frequency difference detector for facilitating the acquisition and tracking of the center frequency $\omega_i$ of a spread spectrum, suppressed-carrier, bi-phase modulated phase shift keyed input signal of the form $m(t)\sin \omega_i t$ including:
   first means for providing first and second in-phase and quadrature signals, respectively, of the form $\sin(\omega_i - \omega_o)t$ and $\cos(\omega_i - \omega_o)t$, respectively;
   second means for differentiating said first and second signals;
   third means for phase shifting the first signal by 180°;
   fourth means for multiplying the differentiated first signal by the second signal to obtain a third signal;
   fifth means for multiplying the phase shifted first signal by the differentiated second signal to obtain a fourth signal; and
   sixth means for summing the outputs of the fourth and fifth means to obtain an output signal equal to $(\omega_i - \omega_o)$.

2. A method for processing in-phase and quadrature signals from a quadrature hybrid of the form $\sin(\omega_i - \omega_o)t$ and $\cos(\omega_i - \omega_o)t$ to derive an output which represents the difference between the respective frequencies $(\omega_i - \omega_o)$ where $\omega_i$ is the center frequency of the suppressed-carrier input signal $m(t)\sin \omega_i t$ and $\omega_o$ is the center frequency of a locally generated reference oscillator, including the steps of:
   (1) differentiating the in-phase and quadrature signals;
   (2) multiplying the differentiated in-phase signal by the quadrature signal to obtain a first product;
   (3) phase shifting the in-phase signal 180°;
   (4) multiplying the phase shifted in-phase signal by the derivative of the quadrature signal to obtain a second product; and
   (5) summing the first and second products to obtain the frequency difference output.

3. A bi-phase demodulator for acquiring and tracking the center frequency $\omega_i$ of the spread spectrum suppressed-carrier bi-phase modulated phase shift keyed input signal including:
   quadrature means for receiving a down converted signal of the form $m(t)\sin \omega_i t$ and providing first and second signals of the form $\sin(\omega_i - \omega_o)t$ and $\cos(\omega_i - \omega_o)t$, respectively;
   differentiator means for differentiating the first and second signals respectively;
   phase shift means for phase shifting the first signal 180°;
   first and second multiplier means for multiplying the differentiated first signal by the second signal and for multiplying the phase shifted first signal by the differentiated second signal, respectively;
   first summing means for summing the outputs of the first and second multipliers to provide a frequency difference term $(\omega_i - \omega_o)$;
   second summing means for coupling the output of the first summing means to a voltage controlled reference oscillator;
   first and second matched low pass filters for filtering said first and second signals;
   third multiplier means for multiplying said filtered first and second signals; and
   loop filter means for deriving from said third multiplier means a DC error voltage for controlling said voltage controlled reference oscillator via said second summing means whereby the output of said voltage control oscillator accurately tracks the suppressed-carrier of the input signal via the quadrature hybrid.

* * * * *